United States Patent [19]
Namikawa et al.

[11] Patent Number: 5,851,956
[45] Date of Patent: Dec. 22, 1998

[54] METHOD OF MANUFACTURING OXIDE CRYSTAL

[75] Inventors: Yasuo Namikawa, Osaka; Xin Yao, Tokyo; Masahiro Egami, Tokyo; Yuh Shiohara, Tokyo, all of Japan

[73] Assignees: Sumitomo Electric Industries, Ltd., Osaka; Ishikawajima-Harima Heavy Industries Co., Ltd.; International Superconductivity Technology Center, both of Tokyo, all of Japan

[21] Appl. No.: 726,917

[22] Filed: Oct. 7, 1996

[30] Foreign Application Priority Data

Oct. 6, 1995 [JP] Japan ................................. 7-260471

[51] Int. Cl.[6] .................................................. C30B 15/02
[52] U.S. Cl. ...................... 505/450; 505/451; 505/729; 117/13; 117/947
[58] Field of Search ...................... 117/13, 947; 505/450, 505/451, 729

[56] References Cited

U.S. PATENT DOCUMENTS

| | | | |
|---|---|---|---|
| 4,994,781 | 2/1991 | Sahagen | 338/47 |
| 5,174,926 | 12/1992 | Sahagen | 252/521 |
| 5,413,988 | 5/1995 | Hayashi et al. | 505/511 |

OTHER PUBLICATIONS

K. Watanabe, "An approach to the growth of $YBa_2Cu_3O_{7-x}$ single crystals by the flux method II", Journal of Crystal Growth 114 (1991) 269–278.

Elizabeth et al., "Growth and extraction of flux free YBCO crystals", Journal of Crystal Growth 121 (1992) 531–535.

Yamada et al., "Enlargement of Single Crystal of Oxide Superconductor", Applied Physics, vol. 62, No. 5 (1993) 459–462.

Yamada et al., "Continuous crystal growth of $YBa_2Cu_3O_{7-x}$ by the modified top–seeded crystal pulling method", Physica C 217 (1993) 182–188.

Namikawa et al., "$YBa_2Cu_3O_{7-x}$ single–crystal growth by the pulling method with crystal rotation effect control", Journal of Materials Research, vol. 10, No. 7 (Jul. 1995) 1593–1600.

Namikawa et al., "Enlargement of YBCO Single Crystals By Crystal Pulling", Proceedings of the 7th International Symposium on Superconductivity (ISS '94) 595–600.

Keester et al., "Growth and Characterization of Large $YBa_2Cu_3O_{7-x}$ Single Crystals", Journal of Crystal Growth, Aug. 1988, vol. 91, No. 3, pp. 295–301, Netherlands.

Yamada et al., "Continuous Crystal Growth of $YBa_2Cu_3O_{7-x}$ by the Modified Top–seeded Crystal Pulling Method", Physica C, vol. 217, No. 1/2, Oct. 1993, pp. 182–188, Netherlands.

Yao et al., Superconductivity and Crystal Growth of YBCO Grown Under 1 atm Oxygen Pressure, Physica C, vol. 263, No. 1–4, May 1996, Netherlands.

Aoyagi et al., "Effect of oxygen concentration in growth atmosphere on the superconductivity of Bi–Sr–Ca–Cu–O fibers prepared by the micro–czochralski technique", Advanced Superconductivity, Vi, Proc. Int. Symp. Supercond> 6 th (1994) pp. 695–698 abstrac, 1994.

Primary Examiner—Robert Kunemund
Attorney, Agent, or Firm—Pennie & Edmonds LLP

[57] ABSTRACT

A large oxide crystal of high quality is manufactured by increasing the speed of crystal growth without affecting crystal growth. A melt of BaO—CuO as a raw material put in a crucible is heated and melt in the presence of a solid phase precipitate of $Y_2BaCuO_5$ and kept at a prescribed temperature. Thereafter, a seed crystal is pulled up while being rotated, with the seed crystal being in contact with the surface of the melt, whereby an oxide crystal having the structure of $YBa_2Cu_3O_{7-x}$ this method, an atmosphere for growing the oxide crystal has an oxygen partial pressure higher than that in an ambient atmosphere.

8 Claims, 1 Drawing Sheet

METHOD OF MANUFACTURING OXIDE CRYSTAL

BACKGROUND OF THE INVENTION

1. Field of the Invention

The present invention relates to a method of manufacturing an oxide crystal and more specifically, to a method of manufacturing a crystal of an oxide superconductor of yttrium group element or lanthanoids group element.

2. Description of the Background Art

An yttrium based oxide superconductor ($YBa_2Cu_3O_{7-x}$, hereinafter referred to as "Y123") has been attracting attention as a high temperature superconducting material having a critical temperature of 90K. Single crystal thereof has been attracting attention as a material for a substrate for manufacturing superconductive electronic devices, and established technique for manufacturing a large single crystal has been desired.

A crystal of Y123 is generated by peritectic solidification at a peritectic temperature of about 1000° C. Generally, for manufacturing a crystal by peritectic solidification, flux method is suitable. For this reason, conventionally, crystal growth according to flux method has been dominantly used in manufacturing a crystal of Y123 in which a crucible of alumina or platinum is used and a BaO—CuO based melt is used as a flux.

However, in the flux method, generation of a crystal nucleus in the melt cannot be controlled, and a number of crystal nuclei are generated. Therefore, it is rather difficult to stably manufacture a large crystal. Another problem is that the BaO—CuO based melt has high reactivity, which makes it difficult to hold the same in the crucible. Further, yttrium solute concentration in the BaO—CuO based melt serving as the flux is as low as 1% or lower near the peritectic temperature, and liquidus gradient is steep. Therefore, it is not possible to have high degree of supersaturation. This means that the speed of crystal growth is low, and hence it is considerably difficult to obtain a large single crystal of Y123 (reference: K. Watanabe, "An approach to the growth of $Yba_2Cu_3O_{7-x}$ single crystals by the flux method II", *Journal of Crystal Growth*, 114, 1991, pp. 269–278, and S. Elizabeth et al., "Growth and extraction of flux free YBCO crystals", *Journal of Crystal Growth*, 121, 1992, pp. 531–535).

Meanwhile, pulling method is a method of crystal growth used for manufacturing a large single crystal of a semiconductor such as Si or GaAs, which is suitable for manufacturing a large single crystal from a melt with high controlability. However, application of this method to Y123 is difficult, because of the above described problem of peritectic solidification and reactivity of the melt.

In view of the foregoing, a method has been proposed in which a single crystal of Y123 is continuously grown by the pulling method, utilizing a yttria crucible and having $Y_2BaCuO_5$ phase as solute source co-existing with the melt at the bottom of the crucible (Solute Rich Liquid-Crystal Pulling (SRL-CP) method). In this method, there is provided a temperature gradient in the longitudinal direction of the melt, and the temperature at the bottom (Tb) is set to be higher than the peritectic temperature (Tp) and surface temperature (Ts) of the melt is set to be lower than Tp. At the bottom of the melt, a liquid phase which is in equilibrium with $Y_2BaCuO_5$ phase, which is in the solid phase at the temperature Tb, is transported to the surface of the melt by convection of the melt. However, solubility of yttrium at temperature Ts is considerably smaller than the solubility at the temperature Tb. Therefore, at the surface of the melt, the liquid phase tends to have high degree of supersaturation at the temperature Ts. Accordingly, as compared with crystal growth by the common flux method, it becomes possible to manufacture a crystal at higher speed of growth (reference: Y. Yamada et al., "Enlargement of single crystal of oxide superconductor", *Applied Physics*, Vol. 62, No. 5, 1993, pp.459–462, and Y. Yamada et al., "Continuous crystal growth of $Yba_2Cu_3O_{7-x}$ by the modified top-seeded crystal pulling method", *Physica*, C217, (1993), pp. 182–188).

Further, a large single crystal has been manufactured by controlling the number of crystal rotation or by controlling conditions for crystal growth considering the state of convection of the melt utilizing simulation of numerical calculation (reference: Y. Namikawa et al., "$Yba_2Cu_3O_{7-x}$ single-crystal growth by the pulling method with crystal rotation effect control", *Journal of MATERIALS RESEARCH*, Vol. 10, No. 7, July 1995, pp.1593–1600, Y. Namikawa et al., "Enlargement of YBCO Single Crystals by Crystal Pulling", Proceedings of the 7th International Symposium on Superconductivity (ISS'94), Nov. 8–11, 1994, Kitakyushu, pp. 595–600).

However, in crystal growth of an yttrium based super conducting material, solute concentration is low near the peritectic temperature and liquidus gradient is steep as described above, and therefore the speed of crystal growth is not sufficiently high even in the SRL-CP method. Under normal conditions, the speed of growth of a Y123 single crystal is 0.05 to 0.1 mm/h, which is considerably lower than the speed of GaAs which is several mm/h, or of Si which is several tens mm/h. Therefore, it takes more than one week to manufacture a single crystal having the length of about 15 mm.

SUMMARY OF THE INVENTION

The present invention was made to solve the above described problems and its object is to manufacture a large oxide crystal of high quality by increasing the speed of crystal growth, without affecting crystal growth.

The present invention contemplates a method of manufacturing an oxide crystal including the steps of heating and melting a material put in a crucible, keeping it at a prescribed temperature and by pulling up a seed crystal by rotating the same and keeping seed crystal in contact with the surface of the melt, for growing and an oxide crystal having the structure of $R_{1+x}Ba_{2-x}Cu_3O_{7-z}$ (where R is an element selected from the group consisting of yttrium and lanthanoids group elements, $0 \leq x \leq 1$ and $0 \leq z \leq 1$), wherein an atmosphere for growing the oxide crystal has higher oxygen partial pressure than the oxygen partial pressure in the atmosphere.

$R_{1+x}Ba_{2-x}Cu_3O_{7-z}$ contains oxygen as its composition. Therefore, the equilibrium phase diagram near the peritectic temperature at which crystallization occurs depends on the partial pressure of oxygen in the atmosphere. For example, in the equilibrium phase diagram of Y123 material, when compared with the ambient atmosphere (where oxygen partial pressure is about 0.21 atm), in an atmosphere having higher oxygen partial pressure, the peritectic temperature (Tp) becomes higher, yttrium concentration at Tp in BaO—CuO solution becomes higher, and liquidus gradient near Tp becomes smaller. By contrast, in an atmosphere having an oxygen partial pressure lower than that in the ambient atmosphere, Tp becomes lower, yttrium concentration at Tp in BaO—CuO solution becomes lower and liquidus gradient near Tp becomes larger. Therefore, in an atmosphere having higher oxygen partial pressure than that in the ambient atmosphere, higher degree of supersaturation can be realized as compared with that in the ambient atmosphere, and hence an oxide crystal can be manufactured at a higher growth rate than that in the ambient atmosphere.

It is preferable that the atmosphere for growing an oxide crystal has an oxygen partial pressure of at least 0.8 atm, and oxygen partial pressure of at least 0.95 atm is more preferable.

Further, it is preferable that the atmosphere for cooling the oxide crystal grown in the above described manner is an inert gas atmosphere.

By cooling the grown oxide crystal in an inert gas atmosphere, it becomes possible to take out a crystal with the crystal structure not subjected to phase transition from tetragonal crystal to orthorhombic crystal, and it becomes possible to obtain an oxide crystal without any twin.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
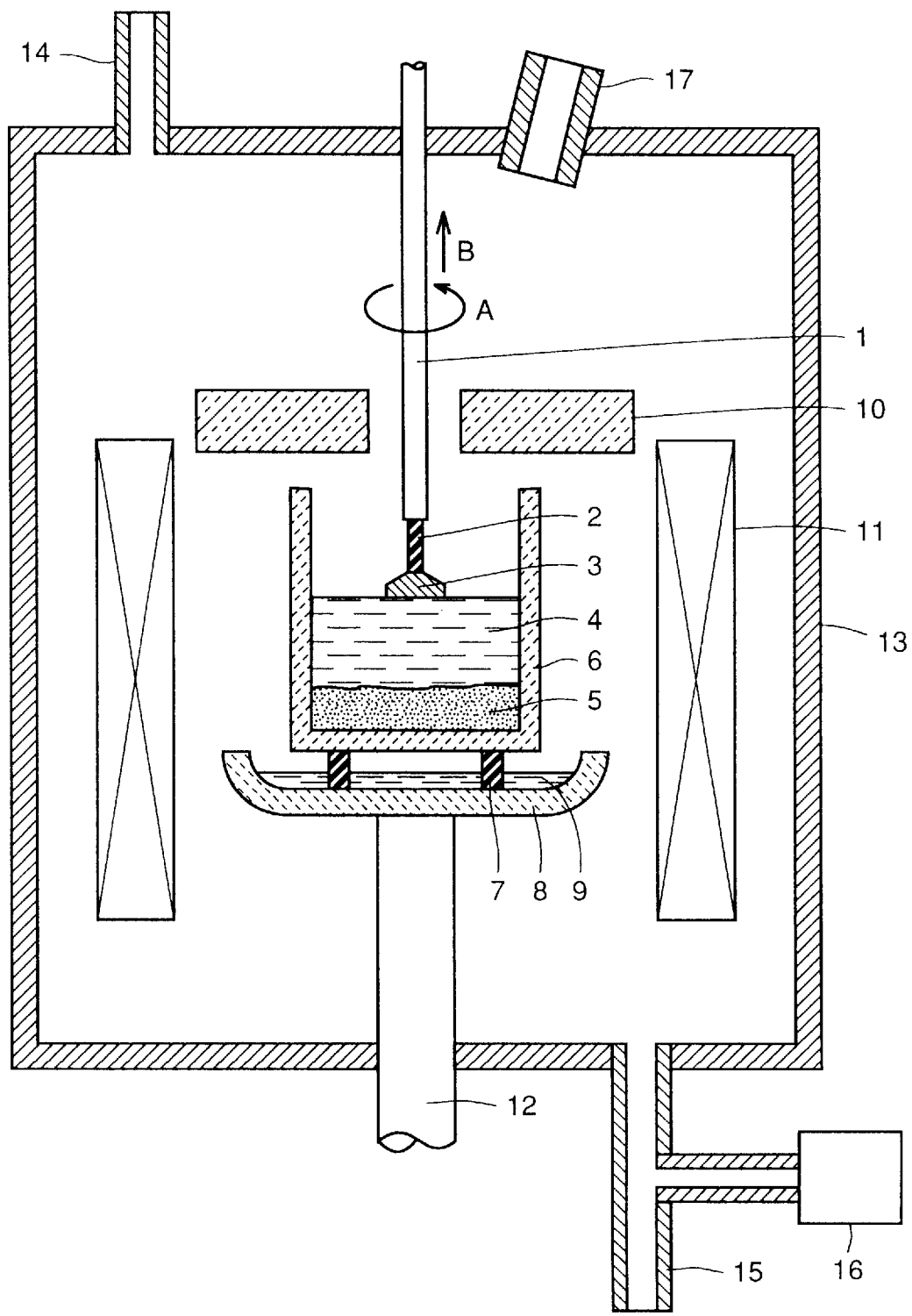
FIG. 1 is a schematic illustration of an apparatus used for performing an embodiment of the present invention, in which a crystal of Y123 is manufactured by pulling method, as an example.

An embodiment of the method of manufacturing an oxide crystal in accordance with the present invention will be described with reference to the figure.

First Embodiment

In the apparatus shown in FIG. 1, there is provided a crystal pull up shaft 1 at an upper portion of the apparatus. At a lower end portion of crystal pull up shaft 1, a seed crystal 2, which is a single crystal of MgO, is provided. A crystal 3 of Y123 is shown grown at the lower end portion of seed crystal 2. Crystal 3 of Y123 grows from a melt 4 of BaO—CuO. Below the melt 4 of BaO—CuO, there is placed a solid phase precipitate 5 of $Y_2BaCuO_5$ (hereinafter referred to as "Y211"). The melt 4 of BaO—CuO and the solid phase precipitate 5 of Y211 are contained in a crucible 6 formed of a $Y_2O_3$ sintered body. Crucible 6 is supported on a plate 8 of $Al_2O_3$ by means of a crucible support column 7 of a single crystal of MgO. The plate 8 contains Ag 9 in the melt state.

A heat insulating material 10 is arranged above crucible 6. Crystal pull up shaft 1 is provided piercing through the central portion of heat insulating material 10. An electric heater 11 is arranged surrounding crucible 6 and plate 8. Crucible 6 and plate 8 are supported in an air tight chamber 13 by a crucible support base 12 formed of a heat insulating material. At an upper portion of air tight chamber 13, there is a gas inlet 14 for introducing oxygen gas or the like. At a lower portion of air tight chamber 13, there is an exhaust vent 15. An oxygen concentration meter 16 is provided at exhaust vent 15. Further, a monitor window 17 is provided at an upper portion of air tight chamber 13.

By using the apparatus structured as described above, a Y123 crystal was manufactured through the following steps.

First, to a lower portion of crucible 6 formed of a $Y_2O_3$ sintered body having an inner diameter of 50 mm, an outer diameter of 60 mm and a depth of 47 mm, $Y_2BaCuO_5$ was introduced. Further, a material provided by mixing barium carbonate and copper oxide to have the molecular ratio of Ba and Cu of 3:5 and by calcination of the same at a temperature of 880° C. for 40 hours was put in an upper portion of crucible 6, as a raw material of BaO—CuO melt 4. A crucible support column 7 formed of MgO single crystal was erected on the plate 8 of $Al_2O_3$, Ag 9 was put therein, and crucible 6 was placed on support column 7.

These were set in air tight chamber 13, oxygen was introduced through gas inlet 14, and oxygen concentration was monitored by oxygen concentration meter 16. The raw material in crucible 6 was melt by heating by electric heater 11 to a temperature of at least 1020° C., with the oxygen concentration in the furnace kept at 95% or higher. At this time, Ag 9 was sufficiently melt, and the periphery of crucible 6 was an Ag atmosphere. $Y_2BaCuO_5$ was solid phase precipitate at the bottom of crucible 6. Further, yttrium was solved into melt 4 from the solid phase precipitate 5 of $Y_2BaCuO_5$. The oxygen flow rate was kept at 450 ml/min, and the pressure in the furnace was 1 atm.

Thereafter, temperature condition was set such that the surface temperature of melt 4 was about 1015° C., and that the temperature different at the surface and the bottom of melt 4 was about 10°C. Thereafter, the pull up shaft 1 with the seed crystal 2 set at the lower end portion was lowered slowly while being rotated at 120 rpm, the lower end portion of seed crystal 2 being brought into contact with the surface of melt 4, and in this manner, crystal growth was started. The orientation of the seed crystal was c axis. Crystal was grown by rotating the pull up shaft 1 in the direction by the arrow A in FIG. 1 and by pulling up the shaft in the direction shown by the arrow B.

By pulling up the pull up shaft 1 for about 93 hours at a pull up speed of 0.05 to 0.08 mm/h, crystal 3 of Y123 could be grown. As for the size of the Y123 crystal 3, when represented by a, b and c axes of the crystal structure of a tetragonal crystal, the area of ab plane was 17.2×16.8 mm$^2$, and the length of the crystal in c axis direction was 12 mm. The actual speed of growth of the crystal, taking into account the lowering of the melt surface during crystal growth, was about 0.13 mm/h. As compared with the speed of growth of the conventional pulling method in the ambient atmosphere (having the oxygen concentration of 21%), this value was about 1.5 to 2.5 times larger. Accordingly, it was confirmed that in an atmosphere having oxygen partial pressure higher than that in an ambient atmosphere, the speed of crystal growth could be increased.

Second Embodiment

A Y123 crystal was manufactured through approximately the same process as the first embodiment, it was separated from the liquid surface of the metal, and the crystal was held at a position 5 mm above the liquid surface. Thereafter, the temperature was set such that the temperature of the crystal was lower than the peritecitic temperature in an atmosphere where oxygen concentration was at most 0.5%, and in this state, oxygen was evacuated through exhaust vent 15 while nitrogen gas was introduced through gas inlet 14, so as to replace the atmosphere in chamber 13. It was confirmed that oxygen concentration was 0.5% or less by oxygen concentration meter 16, and thereafter the crystal was pulled up at a speed of 5 mm/min and taken out from the furnace.

Generally, when a Y123 crystal is cooled in an ambient atmosphere or in an atmosphere having high oxygen partial pressure, oxygen diffuses from the crystal surface during cooling, and the crystal structure suffers from phase transition from tetragonal crystal to orthorhombic crystal. As a result, a number of twin structures are generated near the surface of the crystal. Such twin structure is not preferable when the crystal is to be used as a substrate for superconducting devices.

However, since the crystal is cooled in an inert gas atmosphere in the above described embodiment, crystal can be taken out without phase transition, and hence a tetragonal Y123 crystal without any twin can be obtained.

In the method of manufacturing an oxide crystal of the present invention, a crystal of Y123 has been described in the above embodiments. However, the method of manufacturing of the present invention is applicable to crystal growth of various oxides provided that it has the structure of $R_{1+x}Ba_{2-x}Cu_3O_{7-z}$ (where R represents an yttrium or lanthanoids group element, $0 \leq x \leq 1$, $0 \leq z \leq 1$).

As described above, according to the present invention, in crystal growth of an oxide having the structure of $R_{1+x}Ba_{2-x}Cu_3O_{7-z}$, the speed of crystal growth can be effectively improved, and a large oxide crystal of high quality can be manufactured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing an oxide crystal for growing an oxide crystal having a structure of $R_{1+x}Ba_{2-x}Cu_3O_{7-z}$ (where R is an element selected from the group consisting of yttrium and lanthanoids group elements, $0 \leq x \leq 1$, $0 \leq z \leq 1$) by heating and melting a raw material put in a crucible, keeping it at a prescribed temperature and pulling up a seed crystal while rotating the same with the seed crystal being in contact with a surface of a melt, wherein an atmosphere for growing said oxide crystal has an oxygen partial pressure higher than oxygen partial pressure in ambient atmosphere.

2. The method of manufacturing an oxide crystal according to claim 1, wherein the atmosphere for growing said oxide crystal has an oxygen partial pressure of at least 0.8 atm.

3. The method of manufacturing an oxide crystal according to claim 1, wherein the atmosphere for growing said oxide crystal has an oxygen partial pressure of at least 0.95 atm.

4. The method of manufacturing an oxide crystal according to claim 1, wherein an atmosphere for cooling said oxide crystal is an inert gas atmosphere.

5. The method of manufacturing an oxide crystal according to claim 1, wherein the atmosphere for growing said oxide crystal has an oxygen concentration of at least 95%.

6. The method of manufacturing an oxide crystal according to claim 1, wherein the seed crystal is pulled up at a speed of 0.05 to 0.08 mm/h.

7. The method of manufacturing an oxide crystal according to claim 4, wherein the atmosphere for cooling said oxide crystal is a nitrogen atmosphere.

8. The method of manufacturing an oxide crystal according to claim 4, wherein the atmosphere for cooling said oxide crystal has an oxygen concentration of less than 0.5%.

* * * * *